United States Patent [19]

Kodai et al.

[11] Patent Number: 5,498,388
[45] Date of Patent: Mar. 12, 1996

[54] PRODUCTION METHOD FOR AN IC CARD

[75] Inventors: Syojiro Kodai; Katsunori Ochi, both of Itami; Osamu Murakami, Aamagasaki-Hyogo, all of Japan

[73] Assignee: Mitsubishi Denki Kabushiki Kaisha, Tokyo, Japan

[21] Appl. No.: 384,218

[22] Filed: Feb. 6, 1995

Related U.S. Application Data

[60] Continuation of Ser. No. 94,440, Jul. 21, 1993, abandoned, which is a division of Ser. No. 727,448, Jul. 9, 1991, abandoned.

[30] Foreign Application Priority Data

Jul. 25, 1990 [JP] Japan ............... 2-200706

[51] Int. Cl.$^6$ .................. B29C 45/14; B29C 70/70
[52] U.S. Cl. ............... 264/263; 264/272.15; 264/272.17; 264/275
[58] Field of Search ............ 264/272.11, 272.15, 264/272.17, 275, 274, 261, 263, 294; 425/112, 116, 129.1, 544

[56] References Cited

U.S. PATENT DOCUMENTS

| | | | |
|---|---|---|---|
| 4,216,577 | 8/1980 | Badet et al. | 264/272.17 |
| 4,701,999 | 10/1987 | Palmer | 264/274 |
| 4,843,225 | 6/1989 | Hoppe | 357/72 |
| 4,961,893 | 10/1990 | Rose | 264/272.17 |
| 5,005,282 | 4/1991 | Rose | 264/272.17 |
| 5,030,407 | 7/1991 | Mollet et al. | 264/275 |
| 5,164,144 | 11/1992 | Rose | 264/261 |
| 5,214,846 | 6/1993 | Asami | 264/272.15 |

FOREIGN PATENT DOCUMENTS 55-120153  9/1980  Japan .................. 264/259

Primary Examiner—Jan H. Silbaugh
Assistant Examiner—Angela Ortiz
Attorney, Agent, or Firm—Oblon, Spivak, McClelland, Maier & Neustadt

[57] ABSTRACT

An IC card production method includes the steps of mounting a card board (12) having a through opening onto a lower mold (16) of molding dies (15), mounting a semiconductor module (2) onto the opening of said card board (12), tightening an upper die (17) of the molding dies (15) having a gate (19) onto a lower die (16), and molding by injecting resin (13) into the opening from the gate (19) in a state in which only an electrode terminal face (7) for external connection of the semiconductor module (2) is exposed. The IC card includes a card board (12) having a through opening, a semiconductor module (2) mounted onto this opening, and a molded resin (13) injected into said opening so that the resin moding is formed under such condition that only an electrode terminal face for external connection (7) of said semiconductor module (2) is made to expose.

4 Claims, 7 Drawing Sheets

PRODUCTION METHOD FOR AN IC CARD

This application is a continuation of application Ser. No. 08/094,440, filed on Jul. 21, 1993, now abandoned, which is a division of application Ser. No. 07/727,448, filed on Jul. 9, 1991, now abandoned.

BACKGROUND OF THE INVENTION

1. Field of the Invention

The present invention relates to a production method for an IC card having a semiconductor module embedded in a card board, and to the IC card.

2. Description of the Prior Art

Conventionally, there are known IC cards having semiconductor modules embedded in concaves of a card board and glued thereto. Explanation follows below of an IC card of this kind with reference to FIG. 9a and FIG. 9b.

FIG. 9a shows a plan view of a conventional IC card, and FIG. 9b shows a cross-sectional view taken along the line IX—IX in FIG. 9a. In these figures, a semiconductor module 2 (hereinafter merely referred to as "module") is fastened onto a card board 1. Card board 1 is made by stratifying vinyl chloride resin sheets or by molding of ABS resin or the like, and thereby a concave 1a, onto which the module 2 is embedded, is formed. Concave 1a is formed with its opening facing upward of the card board 1. Module Z consists of a board 4 mounted with a semiconductor element 3, a thin wire 5 electrically connected between a wiring circuit (not illustrated here) of the board 4 and the semiconductor element 3, and a sealed resin 6 which seals semiconductor element 3, thin wire 5, and the like. An electrode terminal 7 for external connection to the IC card is formed on a surface of board 4 and is opposite to the surface on which a semiconductor element is mounted.

The module 2 is formed in such a size that the board 4 and sealed resin 6 are embedded in the concave 1a of the card board 1, and side and bottom faces are respectively made flat.

In the conventional IC card thus structured, assembling is carried out by embedding the module 2 into the concave 1a in such condition that the module 2 or the concave 1a of the card board 1 is applied with adhesive. When assembling the module, a side of sealed resin 6 is first embedded into the concave 1a, so that the electrode terminal 7 can be exposed to the level of an upper surface of the card board.

However, with the conventional IC card production method in which a module 2 is thus embedded into the concave 1a of the card board 1, in order to firmly fasten the module 2 onto the card board 1, it is necessary that the shape of concave 1a be in agreement with that of the module 2, or the shape of the module 2 be in agreement with that of the concave 1a. Unless the shape of those two are in agreement with each other, irregular steps are naturally generated on the surface of IC card. Besides, it is necessary to carry out firm fastening so that the module 2 should not drop from the IC card. Furthermore, it is stipulated in JIS or ISO Standards that there should not be any irregularity or steps of more than 0.1 mm between an electrode terminal and its peripheral card surface. These are some of the various problems that require many processes and necessitate handling of the adhesive which may stain the card surface when the shape of the concave 1a and the shape of module 2 must be made to precisely conform, and when the adhesive must be properly placed therebetween.

SUMMARY OF THE INVENTION

An IC card production method comprises the steps of mounting a card board having a through opening onto a lower mold of molding dies, mounting a semiconductor module onto the opening of said card board, tightening an upper die of the molding dies having a gate onto a lower die, and molding by injecting resin into the opening from the gate in a state in which only an electrode terminal face for external connection of the semiconductor module is exposed. The IC card comprises a card board having a through opening, a semiconductor module mounted onto this opening, and a molded resin injected into said opening so that the resin molding is formed under such condition that only an electrode terminal face for external connection of said semiconductor module remains exposed.

According to the present invention, in the production method of the IC card, it is possible to make the IC card by first setting a module simply into a through opening of an IC board which forms a configuration of an IC card, followed by molding, thereby simplifying the production process when compared with the conventional production method. The invention allows module tolerances to be relaxed thereby simplifying fabrication.

In the IC card of the present invention, the module is firmly held in the card board, thus making it possible to obtain a sturdy IC card with excellent weatherability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1a is a plan view thereof and FIG. 1b is a cross-sectional view taken along the line I—I in FIG. 1a.

FIG. 3a is a bottom view thereof, FIG. 3b is a cross-sectional view taken along the line III—III in FIG. 3a, and FIG. 3c is an enlarged cross-sectional view showing a rib area of the frame.

FIG. 5a is an example made as a rectangular section, FIG. 5b is an example showing the angle which narrows down toward the tip.

FIG. 6a is a bottom view of the frame and FIG. 6b is a cross-sectional view taken along the line VI—VI in FIG. 6a.

FIG. 8a is a plan view thereof and FIG. 8b is a cross-sectional view taken along the line VIII—VIII in FIG. 8a.

FIG. 9a is a plan view thereof and FIG. 9b is a cross-sectional view taken along the line IX—IX in FIG. 9a.

DESCRIPTION OF THE PREFERRED EMBODIMENT

Figure 1A:
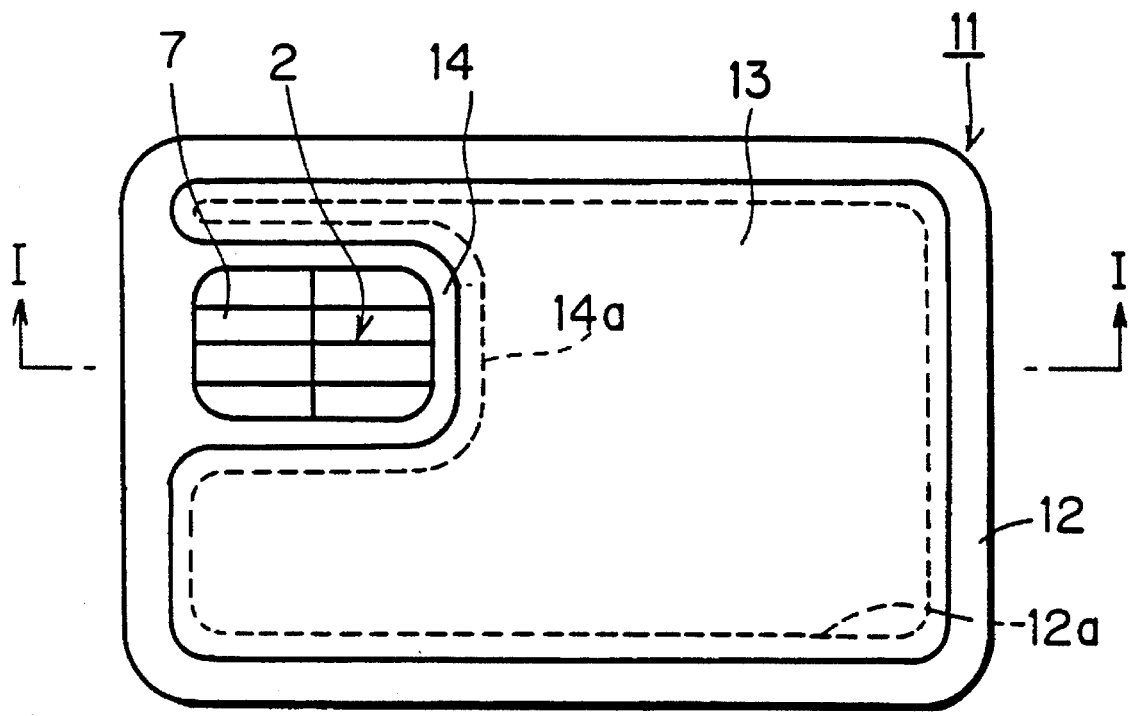
FIGS. 1a and 1b illustrate a first embodiment of the IC card according to the present invention.
Figure 1B:
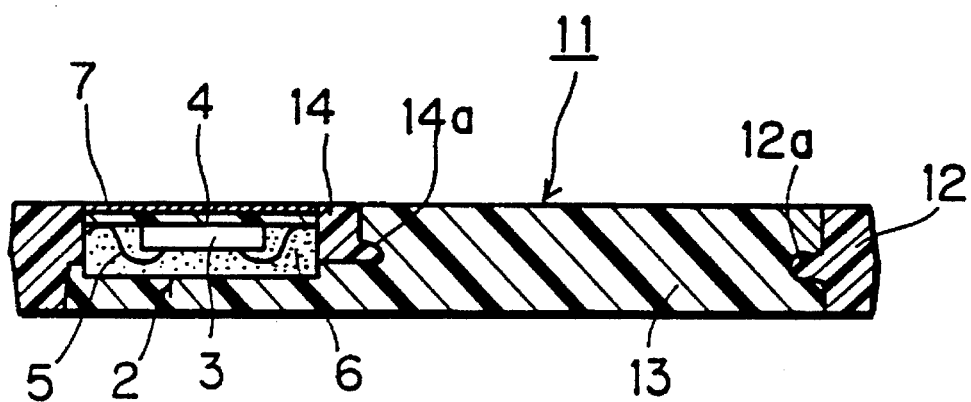
Figure 2:
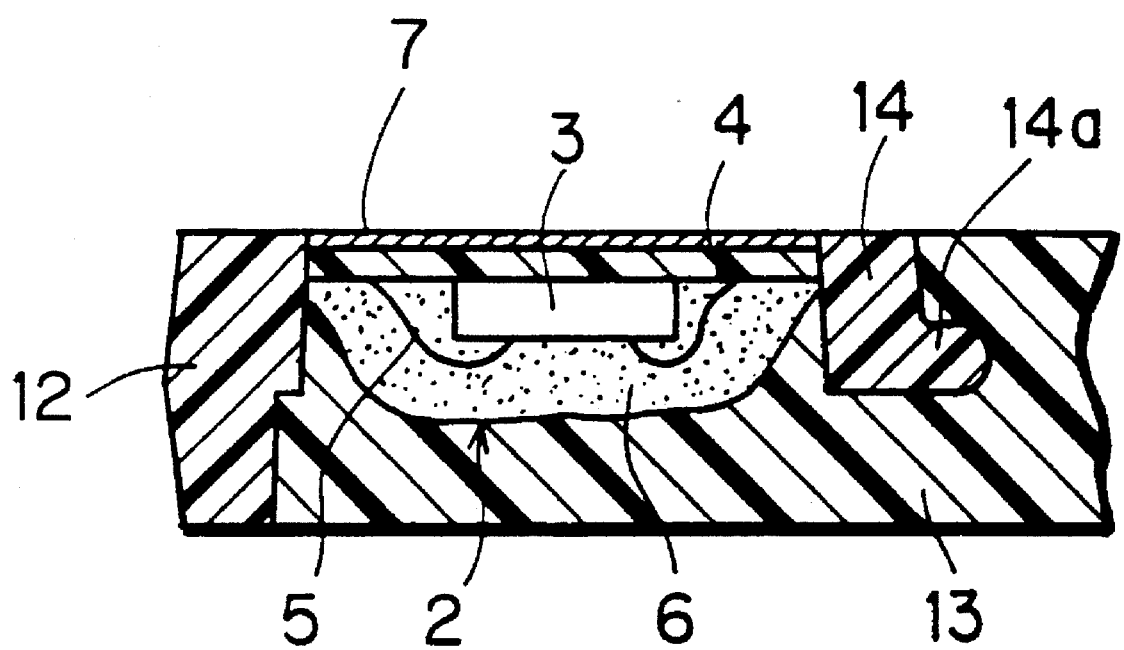
FIG. 2 illustrates an enlarged cross-sectional view showing the main area of the first embodiment.
Figure 3A:
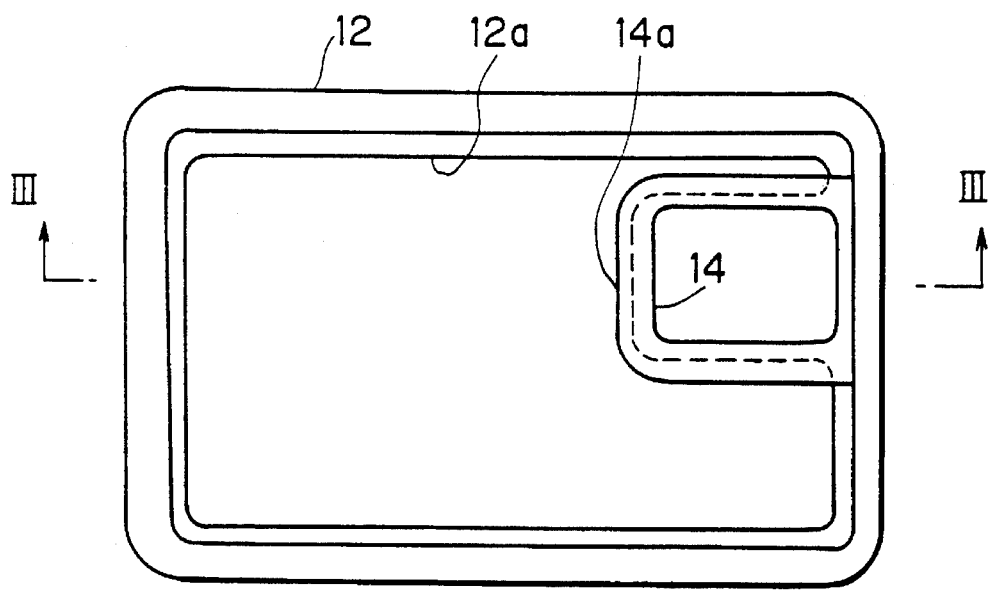
FIGS. 3a to 3c illustrate a frame to be used for the first embodiments.
Figure 3B:
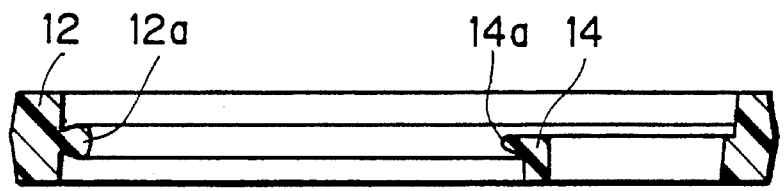
Figure 3C:
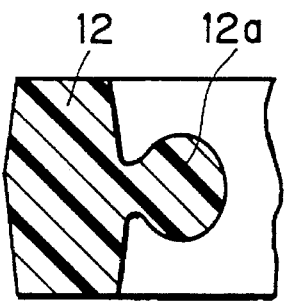
Figure 4:
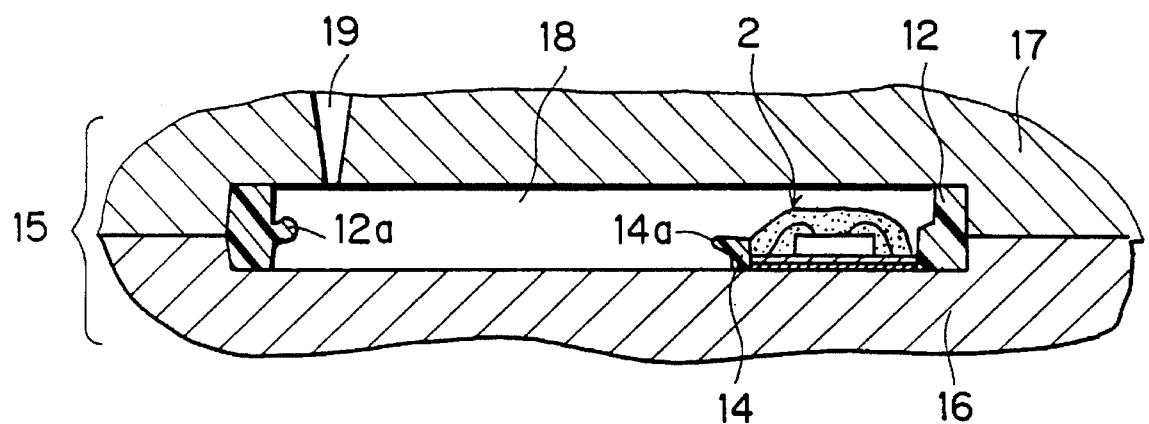
FIG. 4 is a cross-sectional view showing a tightened state of molding dies between which a frame is mounted.
Figure 9A:
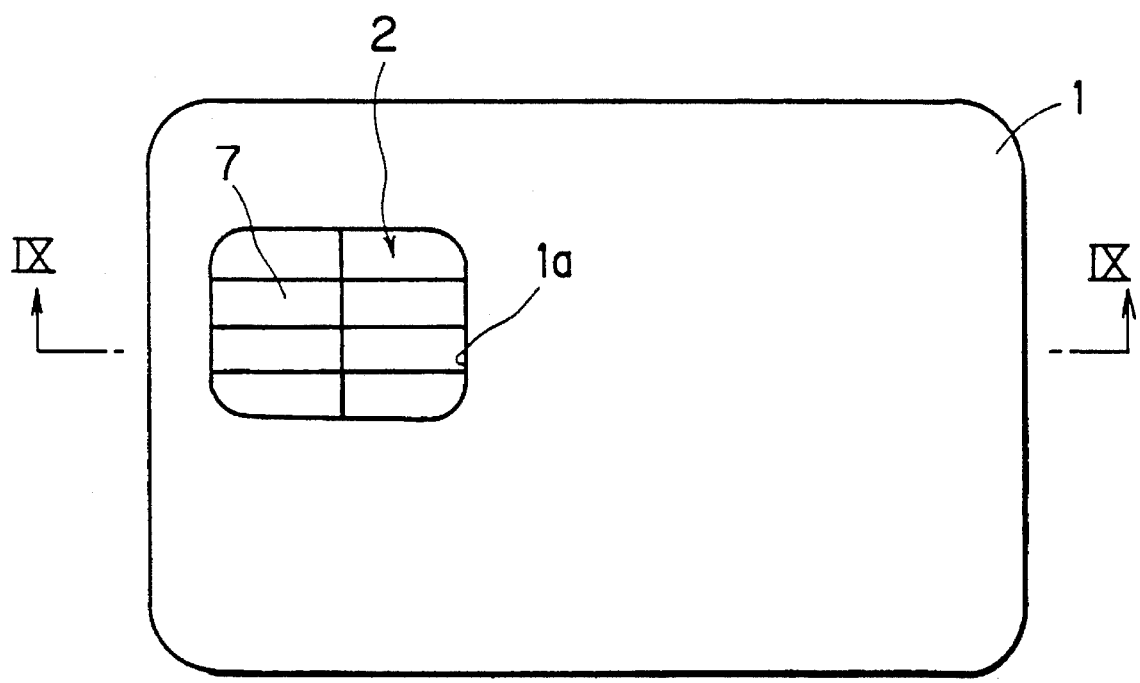
FIGS. 9a and 9b are figures showing a conventional IC card.
Figure 9B:
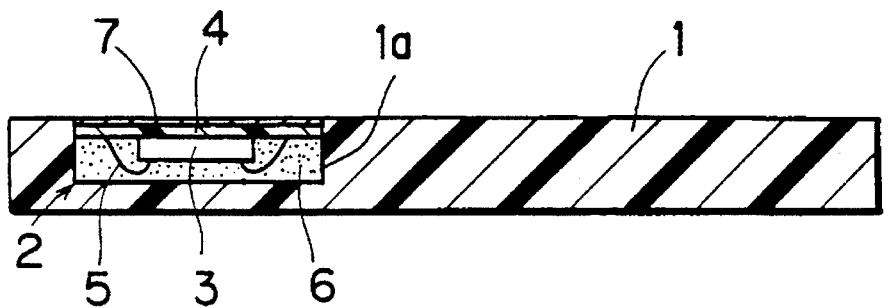

FIGS. 1a and 1b illustrate a first embodiment of an IC card according to the present invention, in which FIG. 1a is a plan view thereof and FIG. 1b is a cross-sectional view taken along the line I—I in FIG. 1a. FIG. 2 is an enlarged cross-sectional view of the main area of the first embodiment. FIG. 3a to FIG. 3c are illustrate frames of the first embodiment, in which FIG. 3a is a bottom plan view, FIG. 3b is a cross-sectional view taken along the line III—III of FIG. 3a, and FIG. 3c is a cross-sectional view showing an enlarged rib area of the frame. FIG. 4 is a cross-sectional view showing a tightened condition of a molding dies onto which the frame is mounted. In these figures, for those members which are the same as those already explained in said FIG. 9a and FIG. 9b, explanations are omitted and the same symbols are used. In those figures, an IC card 11 is composed of a frame 12 which forms an outer periphery of the card and a molded resin 13 injected into an area inside the frame 12. The frame 12 is equal to the thickness of the IC card 11.

In frame 12, a module frame 14 for the module for embedding module 2, which is a functional part of the card, is so formed by being sunken into a molded resin 13 in a monoblock manner so that the upper surface of module frame 14 just comes to the upper surface of the molded resin 13. Besides, module frame 14 is located so that the upper surface of module frame 14 comes to almost the same height as the card surface. Module 2 is set in module frame 14 so that an electrode terminal is exposed on the outer upper side of card 11, and the rest of module 2 is covered with molding resin 13 when molding resin 13 is injected into an opening of frame 12. As indicated by the same hashing marks for frame 12 and module frame 14, these two elements may be formed as a single integral piece.

On an inner periphery of frame 12 and on a lower outer periphery of module frame 14, ribs 12a and 14a having a thickness of about one-third the thickness of the frames 12 and 14, respectively, are continuously arranged. These ribs 12a and 14a disposed approximately at the middle of the card width so that the ribs are not near the card surface. By providing ribs 12a and 14a in this manner when molding is carried out inside the frame 12 with the molded resin 13, the molded resin 13 will not separated from the frame 12 even if the card formed by this method is bent, because the mold resin sandwiches the ribs 12a and 14a on both upper and lower sides.

Frame 14 for module 2 is positioned so it is embedded to about one-half the card width into card 11 so that one face is almost the same height as the card surface and another face is covered with molded resin 13.

Molding dies 15 is a tool for making molded resin 13 inside the area of the frame 12, and molding dies 15 consists of a lower die 16 and an upper die 17 to be tightened with lower die 16. A cavity 18 is provided inside both dies 16 and 17 for mounting frame 12. Cavity 18 is formed with a dimension which corresponds to the external dimension and thickness of frame 12, the bottom and the upper surface of cavity 18 are flat so that the surface of molded resin 13 becomes almost flat after molding. Moreover, a gate 19 is provided on the upper die 17.

Explanation follows of a production method of the IC card of the present invention. In order to produce the IC card of the present invention, first of all, the frame 12 is mounted onto lower die 16 as shown in FIG. 4, and then module 2 is fitted onto module frame 14 so that electrode terminal 7 makes contact with a lower die surface. Then, molding die 15 is tightened by mating the lower die 16 and an upper die 17, molded resin 13 is heated and molten resin is injected into cavity 18 from gate 19 of the upper dye 17. After molded resin 13 hardens frame 12 is separated from the molding dies 15. Consequently, the IC card thus obtained has almost flat surfaces as shown in FIG. 1a. In this case, as materials for the frame 12 and molded resin 13, thermotropic liquid crystal polymer having a high rigidity was adopted. The frame 12 was formed by use of an injection molder which is equivalent to the molding die 15.

In this way, an area and shape of module 2 on the side opposite to the electrode terminal 7 are not restricted as seen in FIG. 4, because of the clearance into which the molded resin 13 flows. Therefore, even if adhesive is applied to the module 2 in advance, the finished thickness of the card is not affected because the molding is carried out by taking the thickness of module 2 into consideration. Specifically, only the external dimension of module 2, which must fit into frame 14 is constrained, and the thickness of module 2 may vary, so long as it does not protrude from the surface of frame 12.

As shown in the first embodiment, ribs 12a and 14a for frame 12 and for module frame 14 are completely embedded in the molded resin 13, thus firmly making the molded resin 13 and the frame 12 into an integral monoblock. In this case, as a cross-sectional shape of ribs 12a and 14a, it is preferable to form a dumbell top shape as shown in FIG. 3c, but it is possible to form shapes as shown in FIG. 5a and FIG. 5b.

Figure 5A:
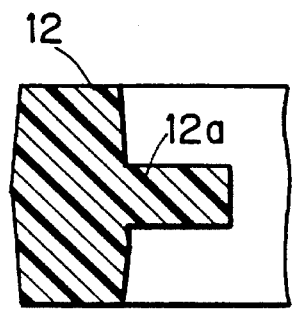
FIGS. 5a and 5b are cross-sectional views showing another example of rib.
Figure 5B:
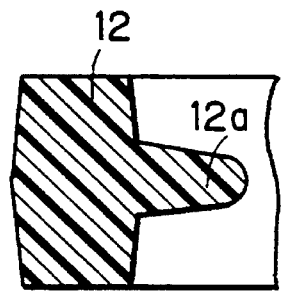

FIG. 5a and FIG. 5b are cross-sectional views showing other examples of ribs, FIG. 5a shows an example of rectangular cross-sectional, and FIG. 5b shows an example of an angle which becomes thinner toward the edge. Depending on size and thickness of the card, even the use of such ribs of these shapes assures complete protection of the frame 12 from the molded resin 13 owing to the rigidity of molded resin 13 in the area of frame 12.

Figure 6A:
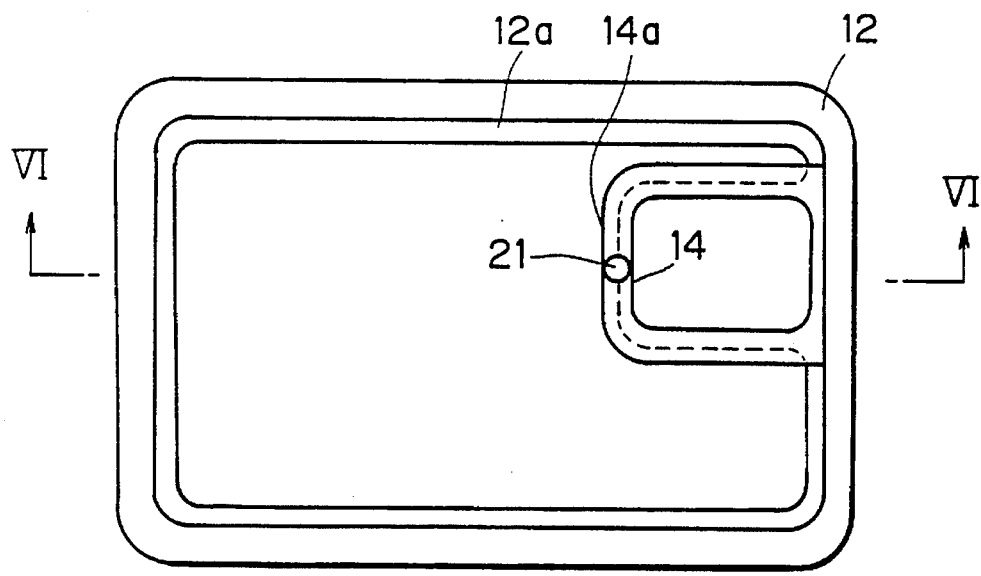
FIGS. 6a and 6b are figures showing a second embodiment provided with a projection for tightening dies on a frame for the module.
Figure 6B:
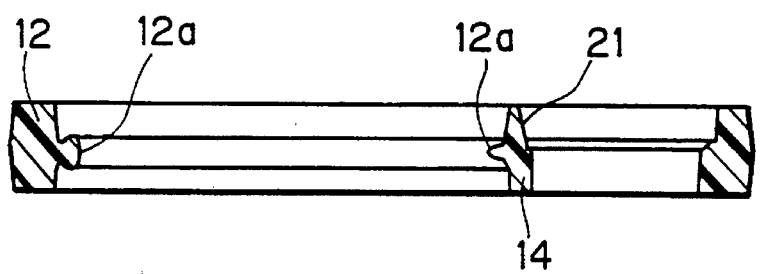
Figure 7:
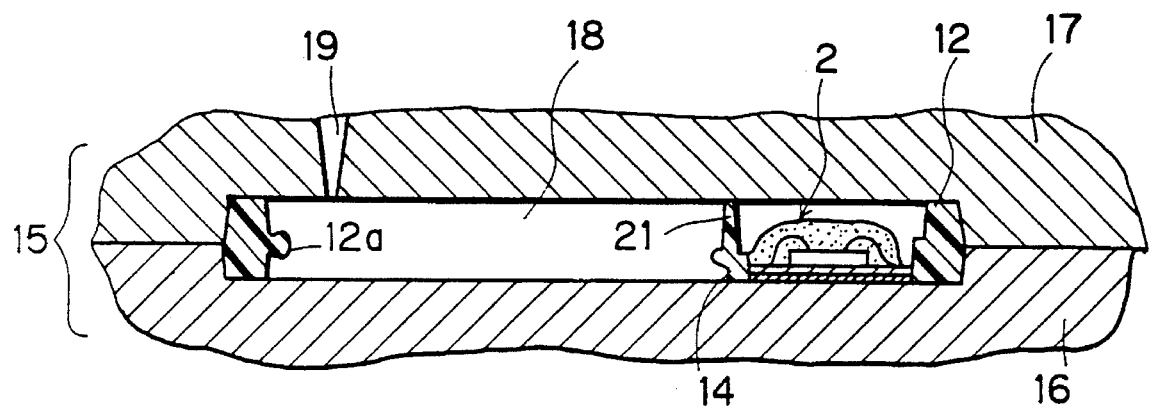
FIG. 7 is a cross-sectional view showing a condition of tightening molding dies between which the frame is mounted which is provided with the projection for tightening the dies.

Module frame 14 allows provision of a projection for tightening as shown in FIG. 6a, FIG. 6b and FIG. 7.

FIG. 6a and FIG. 6b illustrate another example of the frame with a projection for tightening the dies provided in module frame 14, FIG. 6a is a bottom view of the frame, and FIG. 6b illustrates a cross-sectional view taken along the line VI—VI in FIG. 6a. FIG. 7 illustrates a cross-section showing a frame provided with the projection for tightening the dies which tightened up the mounted molding dies. In those figures, explanation is omitted of the same symbols for those members which are the same as or equivalent to ones in FIG. 1 to FIG. 4 that have already been explained. In FIGS. 6a, 6b, and 7, numeral 21 represents a projection for pressing module frame 14 to the lower die 16 when tightening the dies, and this projection 21 is provided at a position furthest from the frame 12 along the module frame 14. The top of projection 21 reaches the back of IC card 11 (the fact which is opposite to the electrode terminal 7 of the module 2). The projection 21 tapers inward toward its upper end. The top of projection 21 contacts the upper die 17 when the frame 12 is mounted onto the molding dies 15, as shown in FIG. 7. Therefore, module frame 14 is pressed against the lower die 16. That is, in case the card is thin, module frame 14 is also thin and projection 21 is effective in protecting module frame 14 and module 2 from lifting in the molding dies during forming a monoblock and particularly during injection molding due to molding resin pressure. If the rigidity of the frame 12 is low, projection 21 protects module frame 14 from lifting up so that molding resin 13 does not cover the surface of electrode terminal 7, thus assuring production without failure. As the top of this projection 21 is exposed to the back of card, the thinner the top of the projection is better.

Explanation follows below of another embodiment of the present invention with reference to FIG. 8a to FIG. 8b.

Figure 8A:
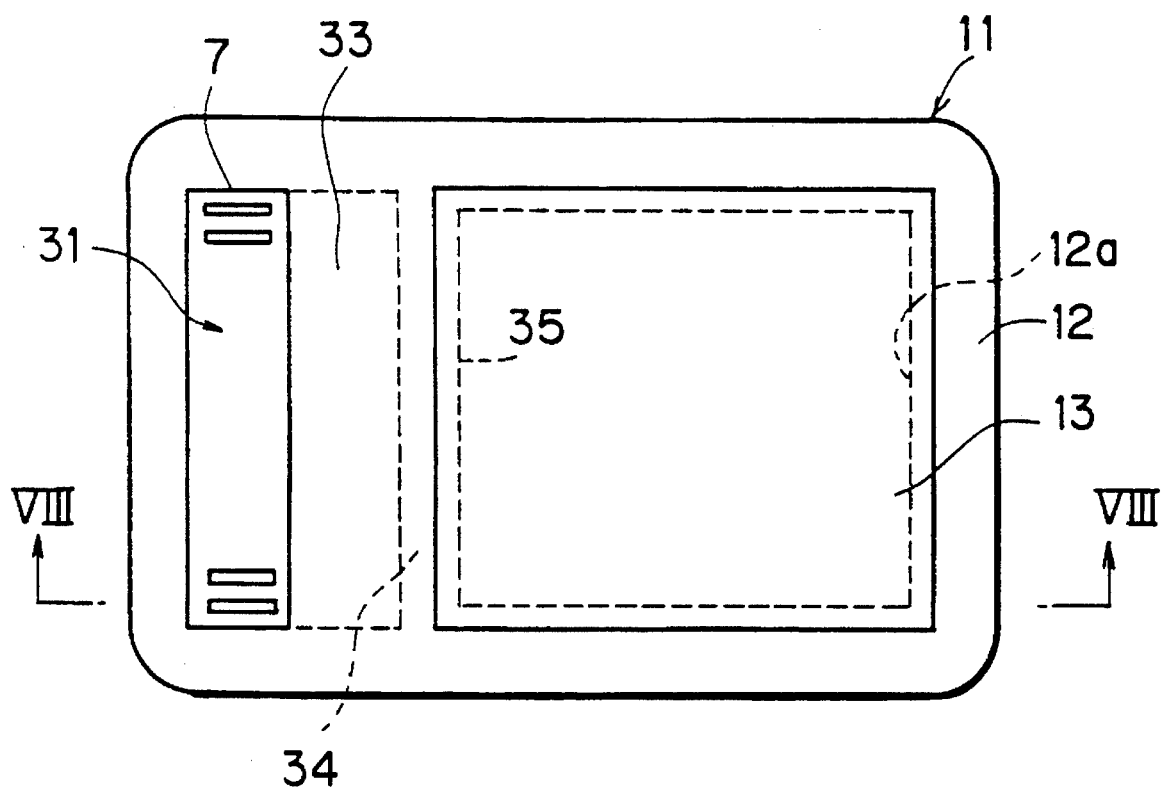
FIGS. 8a and 8b are figures showing a third embodiment of the present invention.
Figure 8B:
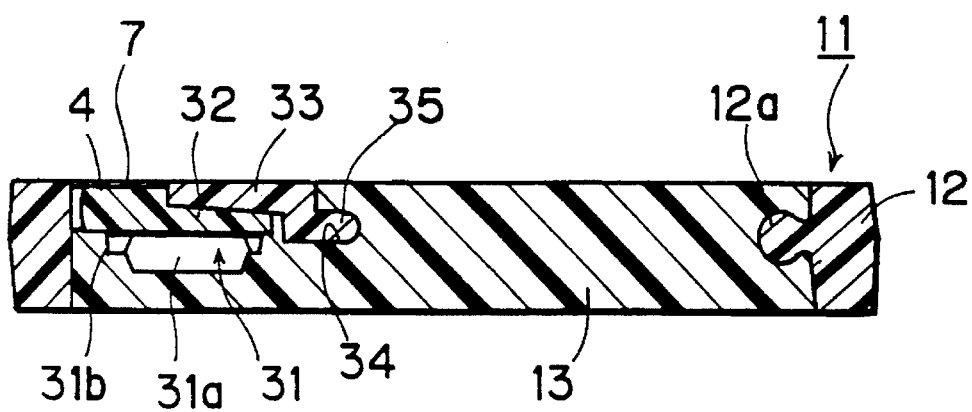

FIG. 8a is a plan view of another embodiment of the present invention and FIG. 8b is a cross-sectional view taken along the line VIII—VIII in FIG. 8a. In these figures, descriptions of those members which are the same as already explained in said FIG. 1 and FIG. 3a and FIG. 3b or their equivalent, are omitted. In these figures, numeral 31 shows a module used for this embodiment, and board 4 of module 31 has a step 32 lower than the electrode terminal area. Numeral 31a represents an IC and numeral 31b represents a connection pin of IC 31. Numeral 33 shows support for module 31 for engaging with module 31, and support 33 is formed in a monoblock manner in frame 12, crossing an opening thereof. Module 31 is fitted into an opening surrounded by support 33 and the frame 12. Fitting is carried out by making the step 32 of the board 4 engaged with support 33 and exposing electrode terminal 7 at the card surface. On the side edge of support 33, a frame 34 is provided so that support 33 engages with the board 4. Rib 35 is formed on frame 34. The height (thickness dimension) of frame 34 is thinner than the card thickness so that the frame is not exposed to the bottom of the card. In this embodiment step 32 of the module 31 is engaged with support 33 which firmly protects module 31 from pressing by a card surface.

Since the IC card is made through the molding by injecting the molded resin 13 in the frames 12 and 14, as shown in FIG. 2, even if the shape of the opposite face to the electrode terminal of module 2 is uneven, thickness of module is irregular, height of the module is varied, or even if a functional part of the module is projected in such cases as in FIG. 8a and FIG. 8b, an IC card having smooth surface and uniform thickness can be obtained, thus making it unnecessary to match the shape of a module interfitted concaved area of a card board to that of interfitted area of a module. Moreover, if only the external shape of the IC card is the same, one die alone allows the molding of any kind of IC cards.

A combination of frame 12 and molded resin 13 provides improved appearance, for instance, by adopting different colors for frame 12 and molded resin 13 of the card board. Making the card body transparent provides convenience in that functional parts and circuit components can be seen from the outside, which also increases the freedom in design of IC cards. It is possible to add decorative designs by printing onto the card surface. Furthermore, as the frame 12 does not overlap the molded resin 13 in a direction of thickness, occurrence of warps of the IC card is very seldom even when various resins are combined, thus providing advantage of greater freedom for selecting card materials.

Since the modules 2 and 31 are firmly fixed when molding, the modules 2 and 31 will not become separated by an external force when hard molding material is used. If soft molded resin 13 is used, a primer treatment on the surfaces of module 2 and 31 or a treatment for bonding with the molding resin may be provided so that modules 2 and 31 will not fall off even if an external pressure is applied. In this case, since the ribs 12a, 14a, and 35 exist in the interfaces between the frame 12, module frame 14, support 33 and molded resin 13, the molded resin 13 will not come off the frame even when an external force resulting from bending is given to the IC card.

While the invention has been shown and described in detail, the foregoing description is in all aspects illustrative and no restrictive. It is therefore understood that numerous modifications and variations can be devised without departing from the scope of the invention.

We claim:

1. A method for producing an IC card, comprising the steps of:

providing a lower molding die having a flat surface;

providing an upper molding die have an aperture;

providing an IC card frame having a through hole between a first IC card frame major surface and a second IC card frame major surface, wherein the first IC card frame major surface is wide and flat, wherein the through hole is defined by IC card frame side surfaces that are between the first and second IC card frame major surfaces and said side surfaces define a first shape;

providing a semiconductor module having a first semiconductor module face containing an electrode terminal and having side surfaces defining a second shape conforming to the first shape of the through hole;

mounting the IC card frame on the lower molding die flat surface so the IC card frame major surface is adjacent the lower molding die flat surface;

mounting the semiconductor module in the through hole such that the side surfaces of the semiconductor module oppose the side surfaces of the IC card frame defining the through hole and the semiconductor module first face contacts the flat surface of the lower molding die;

placing the upper molding die onto the lower molding die; and injecting resin through the aperture in the upper molding die into said IC card frame such that said resin contacts a back surface of the semiconductor module which is on an opposite side of the semiconductor module from the semiconductor module first face and contacts surfaces of the IC card frame, thereby securing, when dry, the semiconductor module to the IC card frame.

2. A method according to claim 1, wherein the step of providing the semiconductor module further comprises the step of providing the semiconductor module with an electrode terminal in the exposed surface.

3. A method according to claim 2, wherein the semiconductor module exposed surface is wide and flat and in the same plane as the IC card frame major surface.

4. A method according to claim 3, wherein the outer surfaces of the semiconductor module define a recessed step which is recessed from the electrode terminal in the exposed surface of the semiconductor module and wherein the through hole of the IC card frame is further defined by surfaces conforming to said recessed step and the step of mounting the semiconductor module in the through hole further comprises engaging the recessed step of the semiconductor module with the conforming surfaces of the IC card frame.

* * * * *

UNITED STATES PATENT AND TRADEMARK OFFICE
CERTIFICATE OF CORRECTION

PATENT NO. : 5,498,388
DATED : March 12, 1996
INVENTOR(S) : Syojiro KODAI et al.

It is certified that error appears in the above-indentified patent and that said Letters Patent is hereby corrected as shown below:

On the title page, Item [75], the third inventor's place of residence is incorrect, and Item [60], the Related U.S. Application Data is incorrect. They should read:

--[75] Inventors: Syojiro Kodai; Katsunori Ochi, both of Itami; Osamu Murakami, Aamagasaki, all of Japan Item: [60]   Related U.S. Application Data Continuation of Ser. No. 94,440, Jul. 21, 1993, abandoned, which is a division of Ser. No. 727,448, Jul. 9, 1991, Patent No. 5,272,374.

Signed and Sealed this

Fifth Day of November, 1996

*Attest:*

BRUCE LEHMAN

*Attesting Officer*         *Commissioner of Patents and Trademarks*